United States Patent [19]
Wilson et al.

[11] Patent Number: 5,907,160
[45] Date of Patent: May 25, 1999

[54] THIN FILM ORGANIC LIGHT EMITTING DIODE WITH EDGE EMITTER WAVEGUIDE

[75] Inventors: James M. Wilson, Glendora; Jean-Michel Guerin, Glendale, both of Calif.

[73] Assignee: Xerox Corporation, Stamford, Conn.

[21] Appl. No.: 08/771,089

[22] Filed: Dec. 20, 1996

[51] Int. Cl.$^6$ .............................. H01L 33/00; H01L 51/00
[52] U.S. Cl. ................... 257/40; 257/98; 257/103
[58] Field of Search ................... 257/40, 98, 103

[56] References Cited

U.S. PATENT DOCUMENTS

| | | | |
|---|---|---|---|
| 4,535,341 | 8/1985 | Kun et al. | 346/107 R |
| 4,720,432 | 1/1988 | VanSlyke et al. | 428/457 |
| 4,769,292 | 9/1988 | Tang et al. | 428/690 |
| 5,105,238 | 4/1992 | Nikaido | 257/40 |
| 5,424,560 | 6/1995 | Norman | 257/103 |
| 5,546,413 | 8/1996 | Lebby | 257/40 |

OTHER PUBLICATIONS

Stephen R. Forrest et al., "Organic emitters promise a new generation of displays", *Laser Focus World*, Feb. 1995, pp. 99–107.

*Primary Examiner*—Jerome Jackson, Jr.
*Attorney, Agent, or Firm*—William W. Propp

[57] ABSTRACT

A thin film organic light emitting diode with edge emitter waveguide comprises, in sequence, a substrate, a waveguide, an anode, a hole transport layer, an electroluminescent layer, and a cathode. Voltage applied between the anode and cathode causes the electroluminescent layer to emit light through the hole transport layer and the anode into the waveguide where the light is internally reflected within the waveguide and propagates through the length of the waveguide to be emitted through the edge of the waveguide. The non-emission edge of the waveguide may be sloped with a conductor layer to the anode and a conductor layer to the cathode forming a reflective surface to the non-emission edge.

3 Claims, 3 Drawing Sheets

FIG. 3
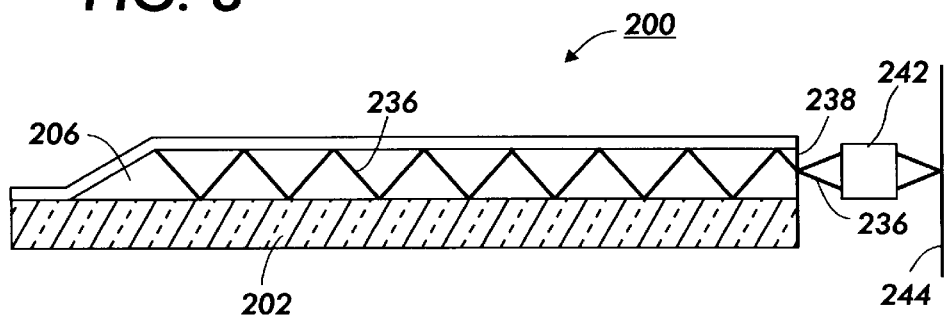
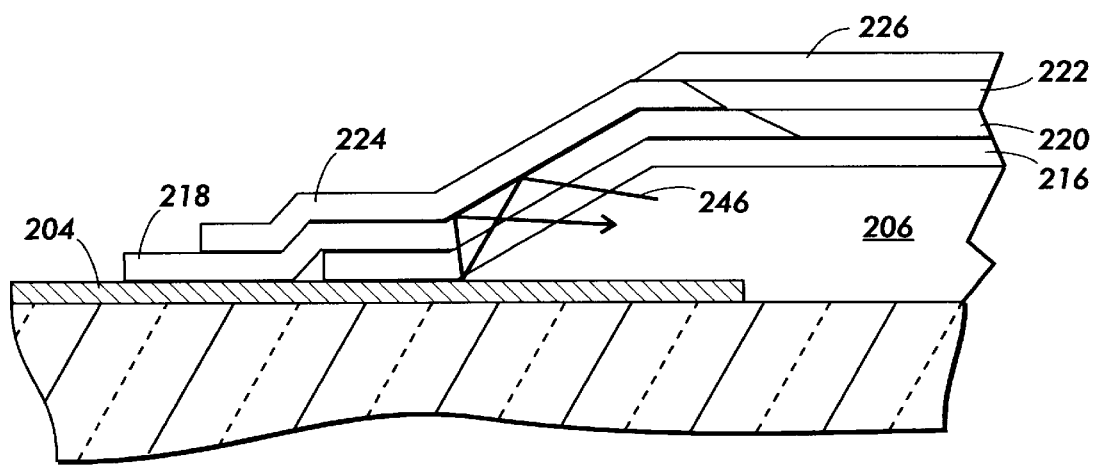
FIG. 4

THIN FILM ORGANIC LIGHT EMITTING DIODE WITH EDGE EMITTER WAVEGUIDE

BACKGROUND OF THE INVENTION

This invention relates to an organic light emitting diode (OLED) and, more particularly, to a thin film organic light emitting diode with edge emitter waveguide.

Thin film organic light emitting diodes typically have an organic electroluminescent medium consisting of two extremely thin layers which are less than 1.0 μm in combined thickness separating the anode electrode and the cathode electrode. One thin film is hole transporting and the other thin film is both electron transporting and also acts as the organic luminescent zone of the OLED device. The extremely thin organic luminescent medium offers reduced resistance, permitting higher current densities for a given level of voltage biasing. The reduced resistance and higher current densities allows applied voltages to be reduced into ranges compatible with integrated circuit drivers, such as field effect transistors. At the same time, light emitted at these low driving voltages have been sufficiently bright to permit visual observation under common ambient lighting conditions.

The OLED contains spaced electrodes separated by an electroluminescent medium that emits electromagnetic radiation, typically light, in response to the application of an electrode potential difference across the electrodes. The electroluminescent medium must not only be capable of luminescing but must also be capable of fabrication in a continuous form (i.e. must be pin hole free) and must be sufficiently stable to facilitate fabrication and to support device operation.

Since the organic luminescent medium is quite thin, light is emitted through one of the two electrodes as a surface emitting OLED. The anode or cathode electrode is a translucent or transparent coating, either on the organic luminescent medium or on a separate translucent or transparent support.

Organic light emitting diodes can be constructed employing thin film deposition techniques. Using an anode as a device support, the organic electroluminescent is deposited as a single film or a combination of films followed by the deposition of a cathode. Thus, starting with the anode structure, it is possible to form the entire active structure of an OLED by thin film deposition techniques. As employed herein the term "thin film" refers to layer thicknesses of less than 5 μm, with layer thicknesses of less than about 2 μm being typical.

Surface emitter OLEDs are not very bright in the surface normal direction. An edge emitter OLED would integrate light from a long emitter area and produce gain in the form of enhanced brightness emitted out of the smaller edge direction. An edge emitter OLED will have an increase in brightness of several times over a surface emitter OLED under similar electroluminescence and voltage conditions.

There are two principal problems with thin film edge emitter OLEDs. First, the thin film electroluminescent layer presents a thin edge or facet to emit the light. Second, the layer surfaces within the OLED structure are lossy, absorbing or blocking the emitted light along the relatively long length of the OLED before the light can be emitted from the edge. Both these problems result in a low intensity emitted light from a thin film edge emitter OLED.

Although surface emitters are conventional in organic light emitting diodes, a thin film electroluminescent line emitter (TFEL) can be an edge emitter, as taught in U.S. Pat. No. 4,535,341 to Kun et al. The thin film edge emitter electroluminescent line emitter has a first dielectric layer, an electroluminescent phosphor layer and a second dielectric layer between a bottom electrode and a top electrode.

The dielectric layers and the phosphor layer have sufficiently different indices of refraction so that light emitted within the phosphor layer will be internally reflected at the first dielectric layer/phosphor layer surface and also internally reflected at the phosphor layer/second dielectric layer surface. The light will eventually be emitted through the edge of the phosphor layer and thus the edge of the OLED.

However, the TFEL has a low propagation efficiency due to grain boundary scattering. The TFEL has waveguiding losses on the order of 400 db/cm. Furthermore, OLEDs operate at a lower voltage than TFELs and may enable a lower loss light emission device with higher overall optical gain.

It is an object of this invention to provide a thin film OLED with edge emission through a waveguide.

SUMMARY OF THE INVENTION

In accordance with the present invention, a thin film organic light emitting diode with edge emitter waveguide comprises, in sequence, a substrate, a waveguide, a hole transport layer, an anode, an electroluminescent layer, and a cathode. Voltage applied between the anode and cathode causes the electroluminescent layer to emit light through the hole transport layer and the anode into the waveguide where the light is internally reflected within the waveguide and propagates through the length of the waveguide to be emitted through the edge of the waveguide.

The non-emission edge of the waveguide may be sloped with a conductor layer to the anode and a conductor layer to the cathode forming a reflective surface to the non-emission edge.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 3 is a schematic illustration of the cross-sectional view of the thin organic light emitting diode with edge emitter waveguide of FIG. 2 with a selfoc lens array.

FIG. 4 is a schematic illustration of the cross-sectional view of the back reflective end of the waveguide of the thin organic light emitting diode with edge emitter waveguide of FIG. 2.

DESCRIPTION OF THE PREFERRED EMBODIMENT

Figure 1:
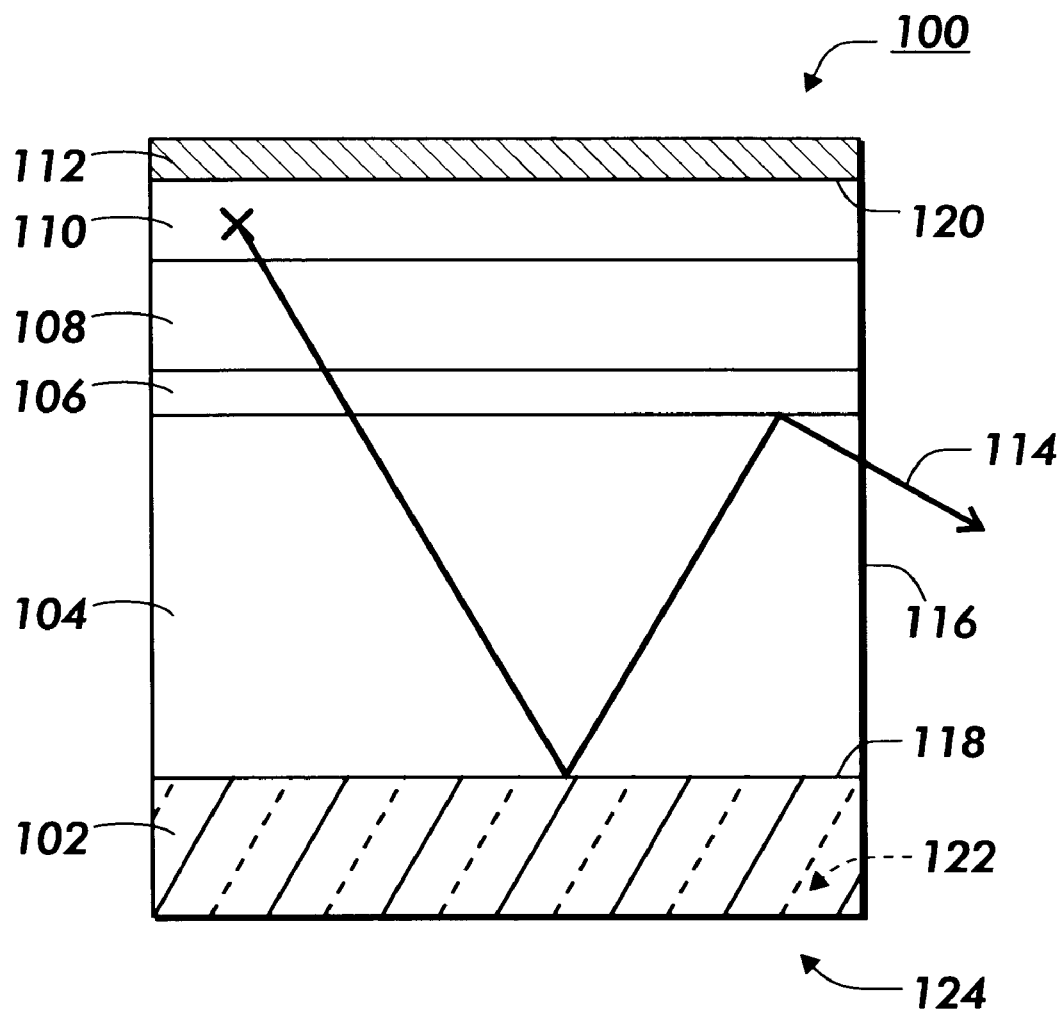
FIG. 1 is a schematic illustration of the cross-sectional view of a first embodiment of a thin organic light emitting diode with edge emitter waveguide formed according to the present invention.

Reference is now made to FIG. 1, wherein there is illustrated the first embodiment of a thin film organic light emitting diode (OLED) with edge emitter waveguide 100 of the present invention.

The thin film organic light emitting diode with edge emitter waveguide 100 comprises, in sequence, a substrate 102 of low refractive index glass, a glass substrate 102, a waveguide 104 of a high index semiconductor material such as $SiN_x$ or $TiO_2$, an anode electrode 106 of indium tin oxide (ITO), a hole transporting layer 108 of TPD, a electroluminescent layer 110 of $AlQ_3$, and a cathode electrode 112 of Mg:Ag.

The layers of the OLED 100 are deposited on the substrate by thin film deposition, as is known in the art. Other means of deposition of the layers would include thermal evaporation, vacuum vapor deposition, spin rotating, sputtering or e-beam.

The anode 106 and the cathode 112 of the OLED are connected to an external power not shown in the Figure. The power source can be a continuous direct current or alternating current voltage source or an intermittent current voltage source. Any convenient conventional power source, including any desired switching circuitry, can be employed which is capable of positively biasing the anode with respect to the cathode. Either the anode or cathode can be at ground potential.

The OLED can be viewed as a diode which is forward biased when the anode is at a higher potential than the cathode. Under these conditions, the anode injects holes (positive charge carriers) into the luminescent medium 110, while the cathode injects electrons into the luminescent medium 110. The hole transporting layer 108 adjacent to the anode thus is a hole injecting and transporting zone while the portion of the luminescent medium adjacent to the cathode forms an electron injecting and transporting zone. The injected holes and electrons each migrate towards the oppositely charge electrode. This results in hole-electron recombination within the electroluminescent medium. When a migrating electron drops from its conduction potential to a valence band in filling a hole, energy is released as light. The wavelength of the light emitted corresponds to the energy gap of the electroluminescent medium 108.

Reverse biasing of the electrodes reverses the direction of charge migration, depletes the luminescent medium of charge carriers, and terminates light emission.

The luminescent medium 108 emits light 114 through the hole transport layer 108 and the anode 106 into the waveguide 104. The light beam 114 will be internally reflected within the waveguide and propagate through the length of the waveguide to be emitted through the edge 116 of the waveguide 104. In effect, the waveguide turns a surface emission into an edge emission. The thickness of the waveguide allows it to function as a multimode waveguide for multiple modes of the light beam.

The anode 106 can be a conductive, relatively high function metal or metal oxide transparent coating on the waveguide 104.

The indices of refraction of the electron transport and light emission layer 110, the hole transport layer 108, the anode 104 and the waveguide 102 are approximately the same. These layers are transparent to the wavelength of light emitted within the layer 110. The emitted light 114 can be transmitted through and within these layers with minimal loss of intensity, with minimal absorption or blocking, and with minimal reflection.

The indices of refraction of the substrate 102 is significantly less than that of the light emission layer 110 and the other layers in the OLED 100.

Typically, the indices of refraction of the electron transport and light emission layer 108, the hole transport layer 106, the anode 104 and the waveguide 102 are in the range of 1.65 to 2.0 while the index of refraction of the substrate is in the range of 1.4 to 1.5.

The cathode 112 by its metallic Mg:Ag material is inherently partially reflective and, to a lesser extent, partially absorptive of the emitted light.

Since the light beam is emitted from and transmitted through the higher density medium to the interface with a lower density medium, if the light beam's angle of incidence to that interface is greater than the critical angle, the light beam will be internally reflected, according to Snell's Law.

The emitted light from the layer 110 will be totally internally reflected at the surface 118 between the waveguide 104 and the substrate 102. The emitted light from the layer 110 will also be internally reflected at the surface 120 between the electroluminescent layer 110 and the cathode electrode 112. Because of the metallic nature of the cathode, the reflectance at surface 120 will be less than the reflectance at surface 118.

The light beam 114 will propagate through the length of the waveguide 104 to be emitted through the edge 116 of the waveguide 104.

The thin film organic light emitting diode with edge emitter waveguide 100 is an isotropic emitter. The light 114 emitted by the electroluminescent medium layer 110 is non-directional, it radiates in all directions.

Light will be emitted and transmitted to the back edge 122 of the OLED 100, opposite the emission edge 116. The medium 124 external to edge 122 may be atmosphere with its index of refraction of 1.0. Thus, the beam, if incident at an angle greater than the critical angle to the edge 122, will be internally reflected from the edge. Alternately, the medium 124 may be a low density, low index of refraction material with the same result.

Alternately, the edge 122 may be a reflective surface with a suitable coating or material known to those of ordinary skill in the art, in which case, the beam will be reflected from the edge. In either instance, the light beam 114 will be reflected from the edge 122 to propagate through the waveguide to be emitted from the emission edge of the OLED.

Multiple reflections from internal reflection surfaces 118 and 120 and reflective edge 122 are possible, if not likely, for a light beam emitted by the layer 110 before being emitted from the edge 116. The light beam must be at an angle less than the critical angle to be emitted from the edge 116.

The sides (not shown in the Figure) of the OLED edge emitter structure 100 can function like the back edge 122 of the structure 100.

Since the medium 124, the sides and the edge 122 connect the anode 104 and the cathode 110, the medium, the sides and the edge should be non-electrical conducting.

The organic material layers in the present embodiment are merely illustrative examples. The indices of refraction of the electron transport and electroluminescent layer, the hole transport layer, the anode and the waveguide should be as high as possible while still maintaining their primary purpose for light emission of an OLED. The index of refraction of the substrate should be as low as possible while still maintaining its primary purpose of support for an OLED. The metallic cathode should be as reflective as possible while still maintaining its primary function for light emission of an OLED. The differences in indices of refraction at the surfaces between the materials allows for internal refraction and a brighter edge emission. The organic materials for the OLED should be chosen accordingly.

The waveguide 104 is several orders of magnitude thicker than the electroluminnescent layer 110. A thicker waveguide reduces the squeezing of the modes into the other layers of the OLED, such as the anode and the hole transport layer and the substrate. A thicker waveguide has a lower mode intensity at the layer interfaces which reduces the light beam's sensitivity to layer surface roughness. A thicker waveguide reduces the diffraction of the emitted light beam at the emission edge resulting in a more parallel emission.

The thin film organic light emitting diode (OLED) with edge emitter waveguide 100 of the present invention is a passive integrating device. Thin film organic light emitting diodes emit a less intense beam in the surface emission direction. The waveguide serves to integrate the lightbeam over the large emitter area and produces gain in the form of a light beam of increased intensity emitted out of the edge facet of the waveguide.

Figure 2:
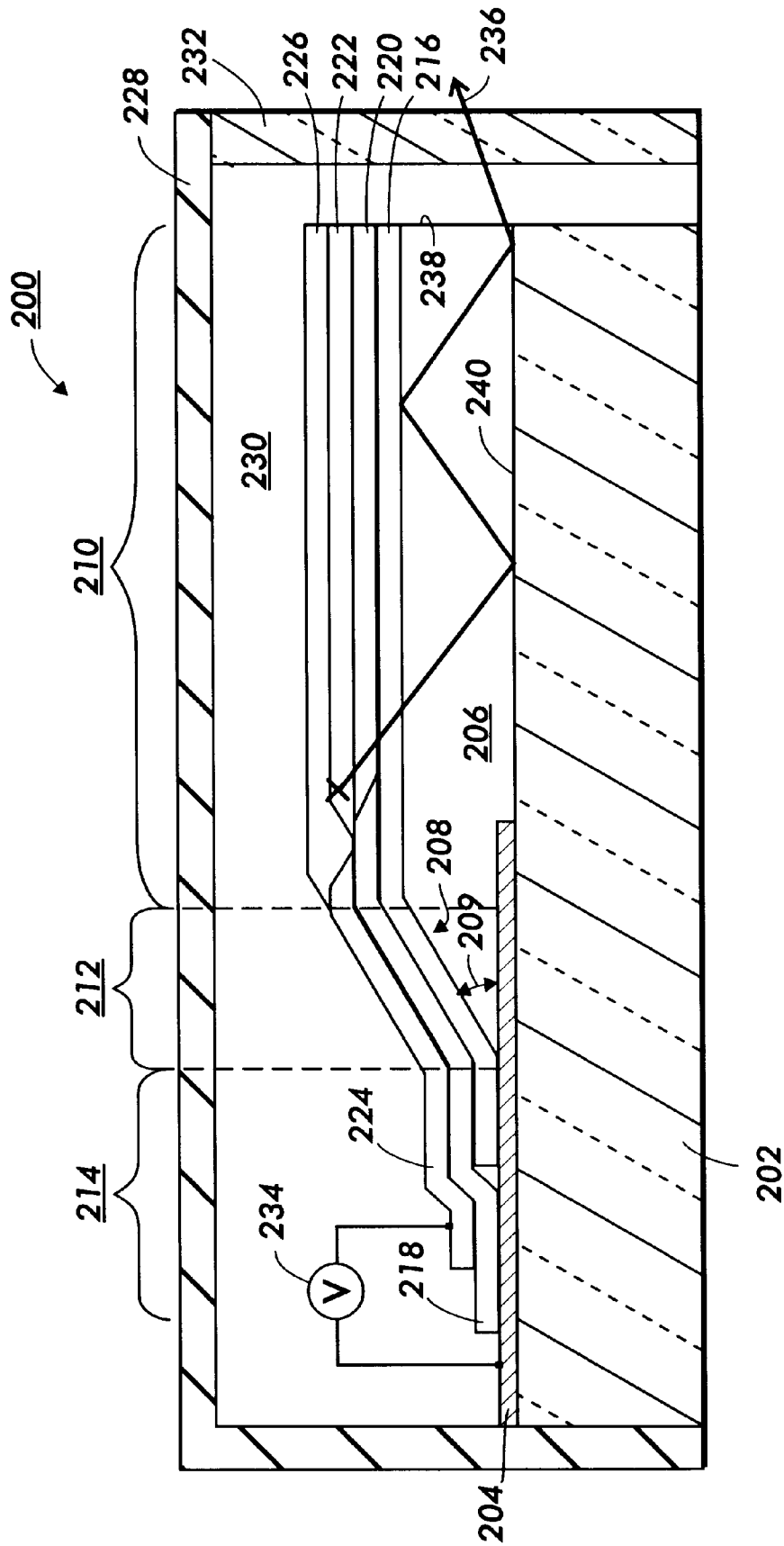
FIG. 2 is a schematic illustration of the cross-sectional view of a second embodiment of a thin organic light emitting diode with edge emitter waveguide formed according to the present invention.

A second embodiment of a thin film organic light emitting diode (OLED) with edge emitter waveguide 200 in FIG. 2 has an angled reflective back end to the waveguide. The thin film organic light emitting diode with edge emitter waveguide 200 comprises a substrate 202 of low refractive index glass. A fan-out conductor 204 of Cr—Au or Ti—Pt—Au or Au—Ge is deposited on a portion of the substrate.

A waveguide 206 of $SiN_x$ or $TiO_2$ is deposited on the substrate 202 and upon a portion of the fan-out conductor 204. The section 208 of the waveguide deposited on the fan-out conductor 204 is sloped, uniformly decreasing, to the conductor 204. The section 208 of the waveguide 206 and the conductor 204 form an acute angle 209. The slope of the waveguide serves two purposes; first, the slopes makes it easier to deposit the subsequent layers since a vertical surface is difficult to deposit material on, and, second, the slope angle provides retroreflection to an incident beam.

For ease of understanding, the OLED 200 can be divided into three sections, the top surface 210, the slope surface 212 and the bottom surface 214. The top surface is the layers on top of the waveguide 206, approximately parallel to the substrate 202. The slope surface is the layers on top of the sloping section 208 of the waveguide at an angle 209 to the substrate 202. The bottom surface is the layers on top of the conductor 204, approximately parallel to the substrate 202.

An anode electrode 216 of ITO is deposited upon the top surface of the waveguide 206, upon the slope surface of the waveguide and upon a portion of the conductor 204. An insulator 218 of $SiN_x$ is deposited upon a portion of the top surface of the anode, upon the slope surface of the anode, upon the bottom surface of the anode and upon a portion of the conductor 204.

A hole transport layer 220 of TPD is deposited on the top surface of the anode electrode 216 and a portion of the top surface of the insulator 218.

The electroluminescent layer 222 of $AlQ_3$ is deposited upon the top surface of the hole transport layer 220 and a portion of the top surface of the insulator 218.

A ground conductor 224 is of Cr—Au or Ti—Pt—Au or Au—Ge deposited upon the remainder of the top surface of the insulator 218, upon the slope surface of the insulator 218 and upon a portion of the bottom surface of the insulator 218. The electroluminescent layer 222 and the ground conductor 224 on the top surface of the insulator do not touch. The ground conductor 224 and the fan-out conductor 204 also do not touch and are separated by the insulator.

A cathode 226 of Mg:Ag is deposited upon the top surface of the electroluminescent layer 222 and the top surface of the ground conductor 224.

A hermetically sealed enclosure 228 can surround the organic light emitting diode 200 with a protective non-corrosive inert gas 230. The enclosure may have a transparent window 232 for emission of the light from the OLED. A protective cladding layer (not shown) may be deposited over the organic light emitting diode 200. The enclosure and protective layer can protect the organic light emitting diode 200 from water vapor, oxygen and other contaminants which degrade the performance of organic light emitting diodes and shorten the life of organic light emitting diodes.

The layers of the OLED 200 are deposited on the substrate by thin film deposition, as previously described.

Unlike the first embodiment of the OLED 100 of FIG. 1, the external power source 234 of the second embodiment of the OLED 200 in FIG. 2 is connected to the fan-out conductor 204 and the ground conductor 224. The fan-out conductor 204 is connected to the anode 216 and the ground conductor 224 is connected to the cathode 226. The power source can be a continuous direct current or alternating current voltage source or an intermittent current voltage source. Any convenient conventional power source, including any desired switching circuitry, can be employed which is capable of positively biasing the anode with respect to the cathode.

The OLED can be viewed as a diode which is forward biased when the anode is at a higher potential than the cathode. Under these conditions, the anode 216 injects holes (positive charge carriers) into the hole transport layer 220 which transports them to the luminescent medium 222, while the cathode 226 injects electrons into the luminescent medium 222. The portion of the luminescent medium adjacent to the cathode forms an electron injecting and transporting zone. The injected holes and electrons each migrate towards the oppositely charge electrode. This results in hole-electron recombination within the electroluminescent medium. When a migrating electron drops from its conduction potential to a valence band in filling a hole, energy is released as light. The wavelength of the light emitted corresponds to the energy gap of the electroluminescent medium.

Reverse biasing of the electrodes reverses the direction of charge migration, depletes the luminescent medium of charge carriers, and terminates light emission. The luminescent medium 222 emits light 236 through the hole transport layer 218 and the anode 216 into the waveguide 206. The light beam 236 will be internally reflected within the waveguide 202 and propagate through the length of the waveguide to be emitted through the edge 238 of the waveguide.

The anode 216 can be a conductive, relatively high function metal or metal oxide transparent coating on the waveguide.

The electroluminescent layer 222, the hole transport layer 220, the anode 216 and the waveguide 206 have approximately the same high indices of refraction, between 1.65 and 2.0. These layers are transparent to the wavelength of light 234 emitted within the layer. The emitted light 236 can be transmitted through and within these layers with minimal loss of intensity, with minimal absorption or blocking, and with minimal reflection.

The indices of refraction of the substrate 202 in the range of 1.4 to 1.5 is significantly less than that of the light emission layer 220 and the other layers in the OLED.

The cathode 226 by its metallic Mg:Ag material is inherently partially reflective and, to a lesser extent, partially absorptive of the emitted light.

The difference in indices of refraction between the waveguide 206 and the substrate 202 causes the emitted light beam 236 to be internally reflected at the surface 240 between the waveguide 206 and the substrate 202 as shown in FIG. 3.

The light beam 236 will propagate through the length of the waveguide 206 to be emitted through the edge 238 of the waveguide as shown in FIG. 3. A selfoc gradient index lens 242 can focus the emitted light beam 236 onto a plane 244.

As best seen in the close-up view of FIG. 4, the fan-out conductor 204 and the ground conductor 222 are reflective to the wavelength of the light beam 246 emitted by the electroluminescent layer that is being propagated within the waveguide 206. The light beam 246 will be internally reflected by the angled conductors 204 and 220 to propagate back towards the emission end 236 of the waveguide 206.

The anode 216 and the insulator 218 at the slope surface 212 have approximately the same index of refraction as the waveguide 206. These layers are transparent to the wavelength of light emitted within the electroluminescent layer.

The reflective fan-out conductor 204 and the reflective ground conductor 220 thus serve a dual purpose in the thin film organic light emitting diode with edge emitter waveguide 200. As conductors, the two conductors supply power to the anode and cathode electrodes of the OLED structure. As reflectors, the two conductors reflect light propagating away from the emission edge back through the waveguide to be emitted through that emission edge.

The slope surface of the waveguide is inherently lossy. However, the slope surface of the waveguide provides a non-perpendicular surface for good subsequent layer deposition.

The sides (not shown) of the OLED 200 of FIG. 2 can be made reflective as discussed with regard to the sides of the OLED 100 of FIG. 1.

The majority of light emitted within the electroluminescent medium layer will be multiple reflected from internal reflection surfaces, the sides, and/or reflective back edge before being emitted from the emission edge.

Unlike the TFEL of the prior art, the OLED edge emitter of the present invention requires a lower drive voltage, a less complex DC driver (as opposed to the TFEL's high voltage AC driver) and emits a brighter light beam.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A thin film edge emitting organic light emitting diode comprising, a substrate, a waveguide on said substrate, said waveguide having a front edge and a back angled reflective edge, an anode on said waveguide, an organic hole transporting layer on said anode, an electroluminescent layer on said organic hole transporting layer, and a cathode on said electroluminescent layer, wherein voltage applied between said cathode and said anode will cause light emission from said electroluminescent layer through said organic hole transport layer and said anode into said waveguide and through said front edge of said waveguide.

2. The thin film edge emitting organic light emitting diode of claim 1 further comprising a first conductor between said substrate and a portion of said waveguide, said first conductor also between said substrate and a portion of said anode, said first conductor applying voltage to said anode, an insulator on a portion of said anode and a portion of said first conductor, and a second conductor on said insulator, said cathode being on a portion of said second conductor, said second conductor applying voltage to said cathode.

3. The thin film edge emitting organic light emitting diode of claim 2 wherein said first conductor is reflective and said second conductor is reflective, said first conductor and said second conductor forming said back angled reflective edge of said waveguide.

* * * * *